United States Patent
Kim

(10) Patent No.: US 9,443,901 B2
(45) Date of Patent: Sep. 13, 2016

(54) IMAGE SENSOR HAVING LENS TYPE COLOR FILTER AND METHOD FOR FABRICATING THE SAME

(71) Applicant: SK hynix Inc., Gyeonggi-do (KR)

(72) Inventor: Sang-Sik Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/841,290

(22) Filed: Aug. 31, 2015

(65) Prior Publication Data

US 2015/0372050 A1    Dec. 24, 2015

Related U.S. Application Data

(62) Division of application No. 14/106,639, filed on Dec. 13, 2013, now Pat. No. 9,153,613.

(30) Foreign Application Priority Data

Aug. 8, 2013 (KR) .................. 10-2013-0094097

(51) Int. Cl.
H01L 27/146 (2006.01)

(52) U.S. Cl.
CPC ... *H01L 27/14685* (2013.01); *H01L 27/14621* (2013.01); *H01L 27/14625* (2013.01); *H01L 27/14627* (2013.01)

(58) Field of Classification Search
CPC ................. H01L 27/146; H01L 27/14685
See application file for complete search history.

(56) References Cited

U.S. PATENT DOCUMENTS

2015/0014802 A1\* 1/2015 Cheng ................. H01L 27/1462
257/432

\* cited by examiner

*Primary Examiner* — Marc Armand
(74) *Attorney, Agent, or Firm* — IP&T Group LLP

(57) ABSTRACT

The image sensor includes lens-type color filters having a uniform shape for a plurality of pixels. The image sensor includes a plurality of pixels formed in a substrate, a plurality of color filter housings formed over outer boundaries of the respective pixels, and a plurality of color filters filled in spaces defined by the respective color filter housings, wherein the clock filter housings surround edges of the respective color filters with a given curvature.

8 Claims, 4 Drawing Sheets

120 # IMAGE SENSOR HAVING LENS TYPE COLOR FILTER AND METHOD FOR FABRICATING THE SAME

CROSS-REFERENCE TO RELATED APPLICATIONS

This application is a division of U.S. patent application Ser. No. 14/106,639 filed on Dec. 13, 2013, which claims priority from Korean Patent Application No. 10-2013-0094097, filed on Aug. 8, 2013. The disclosure of each of the foregoing application is incorporated herein by reference in its entirety.

BACKGROUND

1. Field

Exemplary embodiments of the present invention relate to a semiconductor design technology, and more particularly, to an image sensor with a lens-type color filter and a method for fabricating the same.

2. Description of the Related Art

An image sensor is a semiconductor apparatus which converts an optical image into an electric signal. The image sensor includes a plurality of pixels. Typically, each pixel includes a stack structure comprising a photoelectric device such as a photodiode (PD), a color filter (CF), which selectively transmits incident light having a specific wavelength, and a microlens (ML), which condenses the incident light on the photoelectric device.

In order to reduce the loss of incident light caused by the microlens, a lens-type color filter was introduced. The lens-type color filter may be employed alone or in combination with a microlens to improve the ability to condense the incident light. However, due to limitations in the fabricating process it is difficult to form all of the pixels having a uniform shape of the lens-type color filter.

SUMMARY

Various exemplary embodiments are directed to an image sensor with a lens-type color filter, which includes a plurality of pixels having a uniform shape of the lens-type clock filter, and a method for fabricating an image sensor.

In an exemplary embodiment of the present invention, an image sensor may include a plurality of pixels formed in a substrate, a plurality of color filter housings formed over outer boundaries of the respective pixels, and a plurality of color filters filled in spaces defined by the respective color filter housings, wherein the clock filter housings surround edges of the respective color filters with a given curvature.

In another exemplary embodiment of the present invention, a method for forming an image sensor may include forming sacrificial patterns over a substrate including a plurality of pixels, corresponding to the respective pixels, performing a reflow process on the sacrificial patterns to have a round edge, forming a mold layer along a surface of a structure including the sacrificial patterns, patterning the mold layer using mask patterns as an etching mask to form a plurality of color filter housings surrounding edges of the respective sacrificial patterns with a given curvature; removing the mask patterns and the sacrificial patterns to form spaces defined by the color filter housings, and filling the spaces with color filter materials to form a plurality of color filters over the respective pixels.

According to the embodiments, in pixels, color filter housings are formed to have a uniform shape, and color filter materials are gap-filled in spaces defined by the color filter housings to form lens-type color filters. Thus, the lens-type color filters are formed to have a uniform shape for substantially all of the pixels. Under such a structure, the pixels may have uniform properties (e.g. uniform condensing capacity) and accordingly, the performance of the image sensor may be improved.

In addition, according to the embodiment, the lens-type color filters are formed without a reflow process of color filter material. Thus, disadvantages attributable to the reflow process, such as damage to the color filter, irregular shape of the color filter, complexity of fabrication, etc. may be avoided.

DETAILED DESCRIPTION

Figure 1:
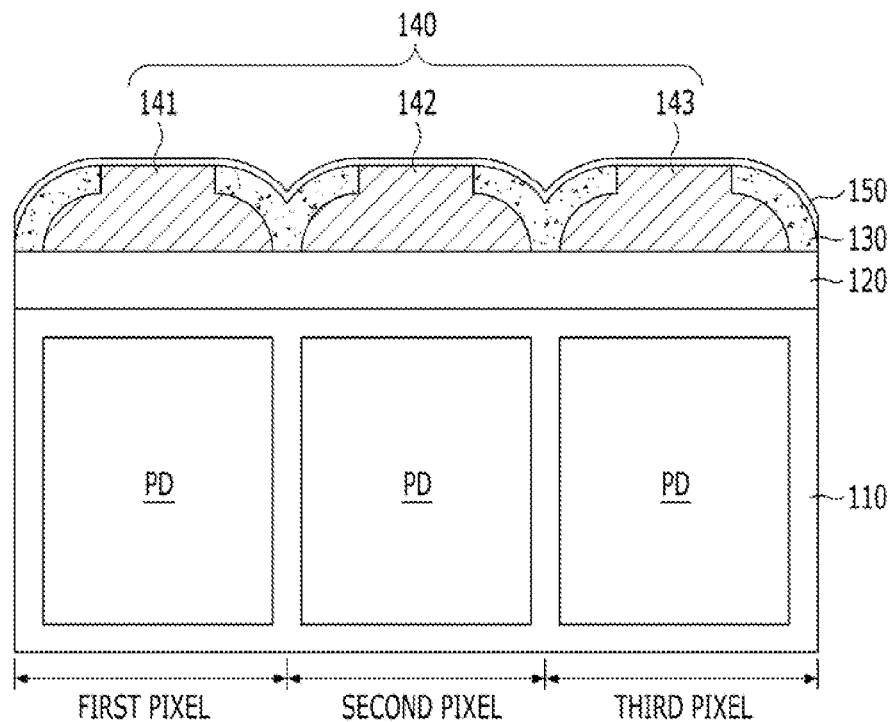
FIG. 1 is a cross-sectional view of an image sensor including a lens-type color filter according to an exemplary embodiment of the present invention.

Various embodiments will be described below in more detail with reference to the accompanying drawings. The present invention may, however, be embodied in different forms, and should not be construed as being limited to the embodiments set forth herein. Rather, these embodiments are provided for illustrative purposes, and may be modified by those skilled in the art. Throughout the disclosure, like reference numerals refer to like parts throughout the various figures and embodiments of the present invention.

The drawings are not necessarily to scale, and in some instances, proportions may have been exaggerated in order to clearly illustrate features of the embodiments. When a first layer is referred to as being "on" a second layer or "on" a substrate, it not only refers to the case where the first layer is formed directly on the second layer or the substrate, but also to the case where a third layer is present between the first layer and the second layer or the substrate.

Exemplary embodiments of an image sensor including a lens-type color filter and a method for fabricating the same will be described below. Typically, a lens-type color filter is formed by sequential processes of depositing a color filter material and patterning the material, and a following reflow process to form the patterned material in a lens shape (e.g., in a hemispherical shape). At this time, different color filter materials may be employed for different pixels since the pixels are to filter incident light having different wavelengths. Since the color filter materials that form the pixels are different, it is difficult to form the lens-type color filters disposed in respective pixels to have a uniform shape (or curvature). When the lens-type color filters of the pixels are formed to have a non-uniform shape, a disparity in properties (e.g., condensing capacity) occurs between pixels. In addition, the color filter material is susceptible to damage caused in the course of the reflow process. Thus, it is not easy to perform the reflow process properly.

Exemplary embodiments of the present invention provide an image sensor in which the lens-type color filters for a plurality of pixels have a uniform shape, and a method for forming such an image sensor. According to the exemplary embodiments of the present invention, a plurality of pixels configured to respond to different wavelengths of incident light are provided over a substrate. Each pixel includes a color filter. A color filter housing having a given curvature is provided so as to surround the outer boundary of the color filter. Specifically, the color filter housing serves as a mold defining (or limiting) the color filter to have a lens shape. The color filter may be gap-filled inside the color filter housing.

An image sensor includes a charge coupled device (CCD) and a switching type CMOS image sensor (CIS). In a CCD individual MOS capacitors are located dose to each other, and charge carriers are stored in the capacitors. CIS employs a CMOS technology, which is applied to a control circuit and a peripheral circuit of a signal processing circuit, to form as many MOS transistors as pixels and detect outputs using them. The exemplary embodiments described below according to the present invention may apply to both the CCD and CMOS image sensor.

FIG. 1 is a cross-sectional view of an image sensor including a lens-type color filter according to an exemplary embodiment of the present invention.

As shown in FIG. 1, the image sensor according to the exemplary embodiment includes a substrate 110. The substrate 110, as a given structure, may include a plurality of pixels and photoelectric devices PD formed in the respective pixels.

The image sensor further includes a buffer layer 120 formed on the substrate 110, a plurality of color filters 140 disposed over the buffer layer 120 and the respective pixels to serve as micro lenses, and color filter housings 130 having a given curvature and surrounding outer boundaries of the color filters 140, respectively.

The pixels over the substrate 110 may include first, second, and third pixels, each responsive to incident light having a specific wavelength different from others. The color filters 140 may include first, second, and third color filters 141, 142 and 143 corresponding to the first, the second, and the third pixels, respectively.

For example, the first, the second, and the third pixels may be a red pixel, a green pixel, and a blue pixel, respectively. The first, the second, and the third color filters 141, 142 and 143 may be a red filter, a green filter, and a blue filter, respectively. Alternatively, the first, the second, and the third pixels may be replaced with a cyan pixel, a yellow pixel, and a magenta pixel, respectively.

The substrate 110 may include a semiconductor substrate. The semiconductor substrate may have a single crystal structure and include a silicon-containing material. That is, the substrate 110 may include a silicon-containing material having a single crystal structure. The photoelectric device PD may include a plurality of stacked photoelectric converting elements (not shown). Each of the photoelectric converting elements may be a photo diode that includes an N-type doping region or a P-type doping region.

As the given structure, the substrate 110, which includes the photoelectric device PD, may further include a signal generating circuit. The signal generating circuit generates an electric signal corresponding to photoelectric charges generated from the photoelectric device PD, and it may include a plurality of transistors, multi-layered metal lines, and a plurality of plugs connecting them. The transistors may include a transfer transistor (TX), a selection transistor (SX), a reset transistor (RX), and an access transistor (AX).

The buffer layer 120 formed over the substrate 110 may serve as a planarization layer that eliminates a step difference, which is created over the substrate 110 by the given structure thereof, and it may further serve as an anti-reflection layer to the incident light. The buffer layer 120 may be an oxide layer, a nitride layer, an oxynitride layer, or a stack layer thereof.

The color filters 140 selectively transmit incident light having different wavelengths for the respective pixels. The incident light is subject to color separation for the respective pixels by the color filters 140 and provided to the photoelectric device PD. The color filters may include organic materials such as Polyacetylene, Poly(p-phenylene), Polythiophene, Poly(3,4-ethylenedioxy thiophene) (PEDOT), Polypyrrole, Poly(p-phenylene sulfide), Poly(p-phenylene vinylene), Polythiophene Poly(thienylene vinylene), Polyaniline, materials equivalent thereto, or a combination thereof. The first, the second, and the third pixels are configured to respond to incident light having different wavelengths. Accordingly, the first, the second, and the third color filters 141, 142 and 143 may include different materials.

The color filter housings 130 with a given curvature serve to define the color filters 140 in a lens form so that the color filters 140 may serve as microlenses. The color filter housings 130 may surround the respective filters along the outer boundaries of the respective filters.

The color filters 140 fill spaces created by the color filter housings 130. Due to the color filter housings 130, the color filters 140 may be formed to have a uniform shape (that is, a uniform curvature) for substantially all pixels.

The color filter housings 130 may include an insulation layer. The insulation layer may include an oxide layer, a nitride layer, an oxynitride layer, or a stack layer thereof. The color filter housings 130 refract incident light to a direction perpendicular to a surface of the photoelectric device PD to increase condensing capacity. The color filter housings 130 may further serve as anti-reflection layers. To properly perform this function, the color filter housings 130 may have a refractive index lower than that of the color filters 140 but higher than that of air.

In addition, the color filter housings 130 prevent the color filters 140 from being damaged. This function will be described below in greater detail.

The image sensor according to the exemplary embodiments may further include a protection layer 150 over the given structure, which includes the color filters 140 and the color filter housings 130. The protection layer 150 may be formed to have a given thickness along a surface of the given structure, which includes the color filters 140 and the color filter housings 130. The protection layer 150 may include an insulation layer such as an oxide layer, a nitride layer an oxynitride layer, or a stack layer thereof.

The protection layer 150 may function as an anti-reflection layer in addition to protecting the color filters 140 and the color filter housings 130. The protection layer 150 may have a refractive index lower than those of the color filter housings 130 and the color filters 140 and higher than that of air.

Although not shown, microlens may be further provided to be corresponding to the respective pixels. In that case, the protection layer 150 may be a planarization layer covering a surface of the substrate 110 including the color filters 140. The microlens may further increase condensing capacity when used along with the color filters 140.

As described above, by employing the color filter housings 130 with a given curvature, the lens-type color filters may be formed in a uniform shape in substantially all pixels having the same size. Accordingly, an image sensor may be obtained where pixels have uniform properties (e.g., condensing capacity).

Meanwhile, though not illustrated, in case where all pixels do not have the same size, e.g., the first and third pixels have a first size while the second pixel has a second size larger than the first size, the lens-type color filters in the second pixel may be formed to have a size larger than the first and third pixels. However, even in this case, the color filter housings 130 may be formed to have a given curvature, and the lens-type color filters may be formed in a uniform shape in substantially all pixels but have a different size in each pixel.

Referring to FIGS. 2A to 2G, an embodiment of a method for forming the image sensor including lens-type color filters shown in FIG. 1 will be described below. The lens-type color filters may maintain a uniform shape for substantially all pixels by employing the color filter housings.

FIGS. 2A to 2G are cross-sectional views showing an exemplary embodiment of a method for forming the image sensor employing lens-type color filters.

Figure 2A:
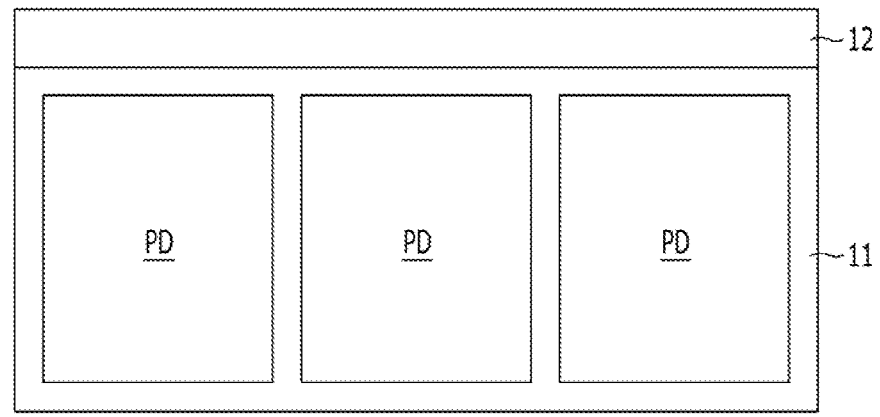
FIGS. 2A-2G are cross-sectional views showing a method for fabricating an image sensor including a lens-type color filter according to an exemplary embodiment of the present invention.

As shown in FIG. 2A, a given structure including photoelectric devices PD is formed over a substrate 11 including a plurality of pixels, e.g., first, second, and third pixels. The first, the second, and the third pixels may be a red pixel, a green pixel, and a blue pixel, respectively. The photoelectric devices may include photodiodes. The given structure may further include a signal generating circuit that includes a plurality of transistors, a multi-layered metal line, and a plurality of plugs interconnecting them.

Then, a buffer layer 12 is formed over the substrate over which the given structure including the photoelectric devices PD is formed. The buffer layer 12 may serve as a planarization layer to eliminate a step difference caused over the substrate 11 by the given structure thereof. The buffer layer 12 may further serve as an anti-reflection layer. The buffer layer 12 may include an insulation material. For example, the buffer layer 12 may include an oxide layer, a nitride layer, an oxynitride layer, or a stack layer thereof.

Figure 2B:
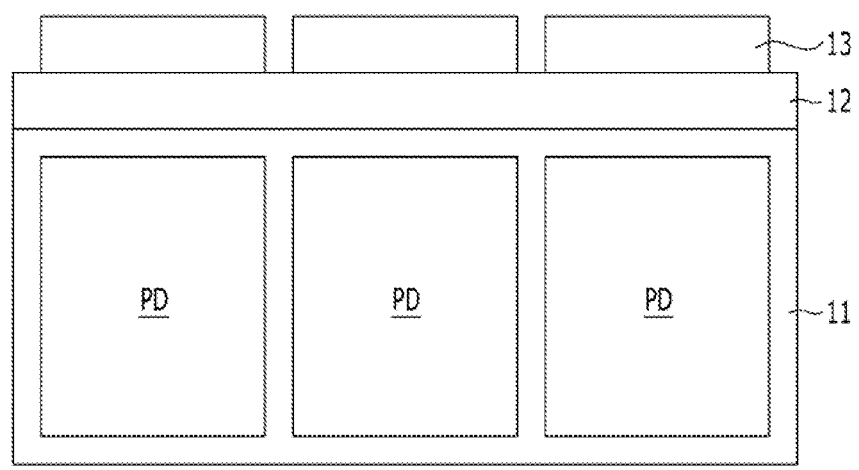

As shown in FIG. 2B, sacrificial patterns 13 are formed over the buffer layer 12. The sacrificial patterns 13 may be formed over the pixels while exposing the buffer layer 12 formed over outer boundaries of the respective pixels. The sacrificial patterns 13 may be formed of a material that is suitable for a reflow process, such as a photoresist material. For example, a photoresist may be deposited over the buffer layer 12, and an exposure and development process may be subsequently performed in order to form the sacrificial patterns 13.

Figure 2C:
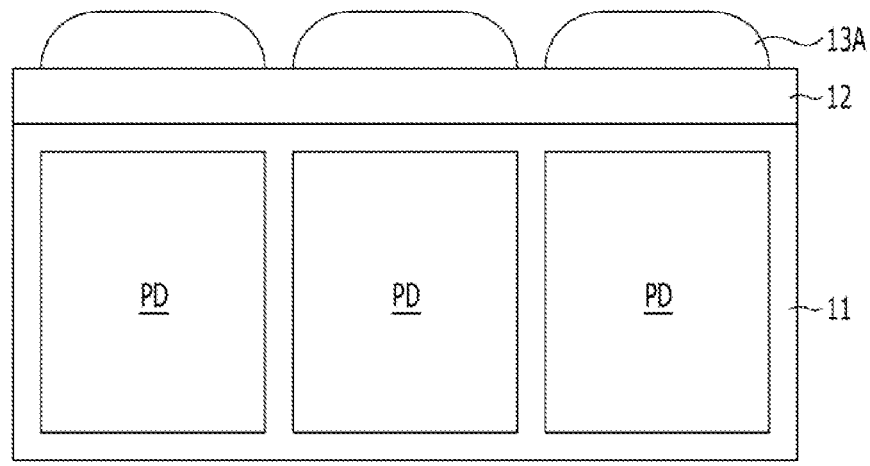

As shown in FIG. 2C, the reflow process is performed on the sacrificial patterns 13 in order for the sacrificial patterns 13 to have a round edge (i.e., convex curvature). That is, the reflow process results in lens-type sacrificial patterns 13 having a given curvature, that is, having a hemispherical form. Hereinafter, the lens-type sacrificial patterns 13 with a given curvature resulting from the reflow process will be denoted as the numeral reference '13A'.

The reflow process may be performed by a thermal treatment and is controlled so that neighboring sacrificial patterns 13A do not come into contact with each other in the course of the reflow process. Since the sacrificial patterns 13 are formed of the same material, the lens-type sacrificial patterns 13A have the same form and curvature through the reflow process.

Figure 2D:
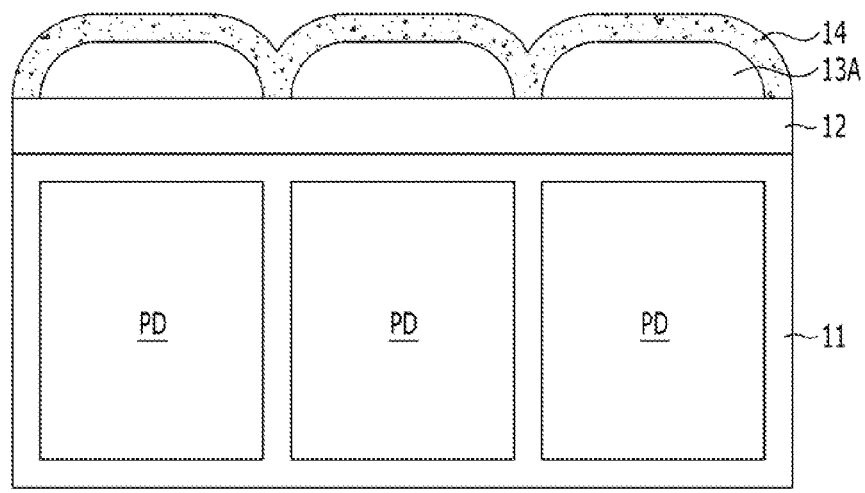

As shown in FIG. 2D, a mold layer 14 is formed to have a given thickness along the surface of the structure that includes the sacrificial patterns 13A. The mold layer 14 may be formed to have a thickness such that it fills the space between neighboring sacrificial patterns 13A.

The mold layer 14 may include an insulation material. For example, the mold layer 14 may include an oxide layer, a nitride layer, an oxynitride layer, or a stack layer thereof. The mold layer 14 may include an insulation layer whose refractive index is lower than that of the color filters, which will be formed in a subsequent process, and higher than that of air.

Figure 2E:
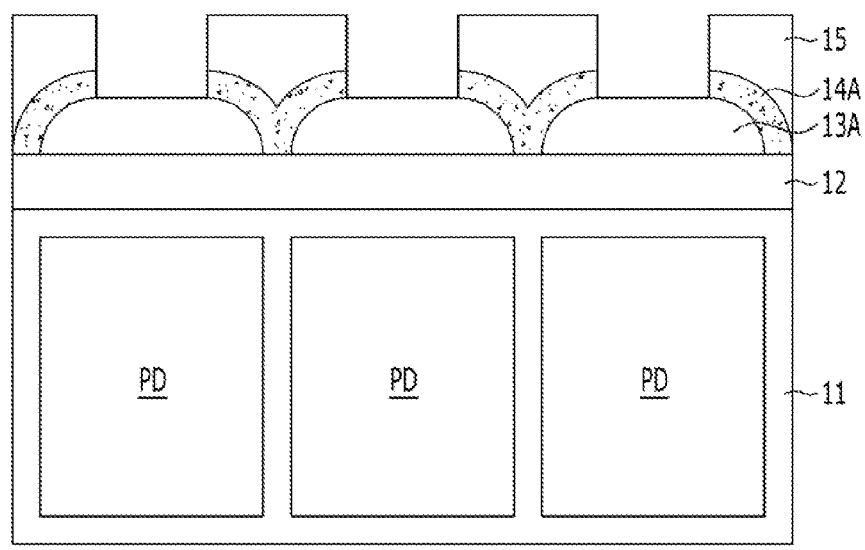

As shown in FIG. 2E, mask patterns 15 are formed over the mold layer 14. The mask patterns 15 may be formed in a manner such that they cover edges of the respective pixels and have openings in the centers of the respective pixels so that the mold layer 14 is exposed.

To simplify the fabrication process, the mask patterns 15 may be formed of the same material as the sacrificial patterns 13A. For example, the mask patterns 15 may include a photoresist material. When a photoresist material is employed, the photoresist material may be deposited over the mold layer 14 and subject to an exposure and development process to form the mask patterns 15.

The molder layer 14 is etched using the mask patterns 15 as an etching barrier to form color filter housings 14A. The color filter housings 14A may have a concave curvature inside, corresponding to the convex curvature of the sacrificial patterns 13A, and it may surround edges of the sacrificial patterns 13A. By using the sacrificial patterns 13A, the color filter housings 14A are formed in the same shape for substantially all pixels. Thus, the curvatures of the color filter housings 14A may be substantially the same for all pixels.

Figure 2F:
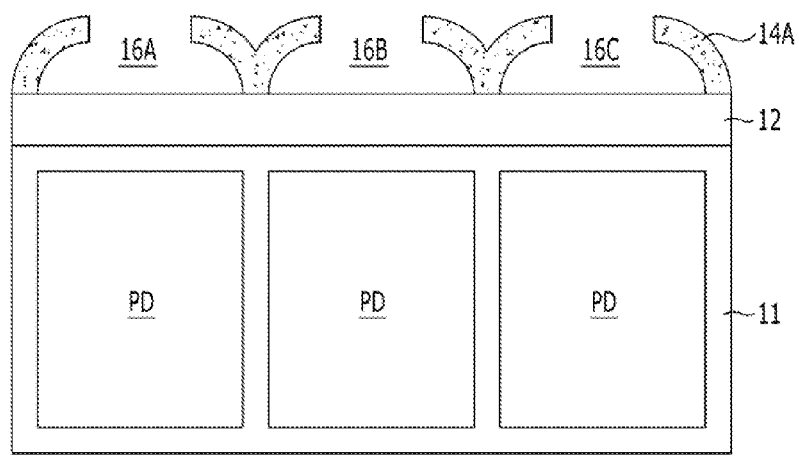

As shown in FIG. 2F, the mask patterns 15 and the sacrificial patterns 13A are removed. When the mask patterns 15 and the sacrificial patterns 13A are formed of the same material, they may be remove at the same time, thus simplifying the process. For example, when the mask patterns 15 and the sacrificial patterns 13A are formed of a photoresist, they may be removed at the same time by an ashing process or by oxide plasma treatment.

Upon removing the mask patterns 15 and the sacrificial patterns 13A, spaces 16A, 16B and 16C are defined by the color filter housings 14A formed along the outer boundaries of the respective pixels. Specifically, first, second, and third spaces 16A, 16B and 16C are defined by the color filter housings 14A, corresponding to the first, the second, and the third pixels, respectively.

Figure 2G:
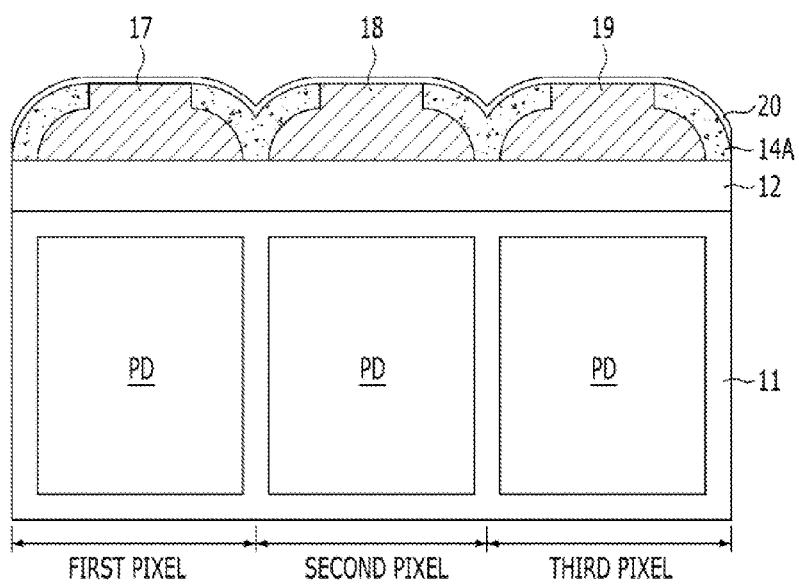

As shown in FIG. 2G, the spaces 16A, 16B and 16C defined by the color filter housings 14A are filled with color filter materials to form a plurality of color filters 17, 18 and 19.

Since the color filter housings 14A have the same curvature for substantially all pixels and the color filters 17, 18 and 19 are formed by filling the spaces 16A, 16B and 16C defined by the color filter housings 14A, the color filters 17, 18 and 19 may have substantially the same shape (that is, the same curvature) for all pixels. That is, by employing the color filter housings 14A, the color filters 17, 18 and 19 may be formed to have the same lens shape for substantially all pixels.

The color filter material may include an organic material such as Polyacetylene, Poly(p-phenylene), Polythiophene, Poly(3,4-ethylenedioxy thiophene) (PEDOT), Polypyrrole, Poly(p-phenylene sulfide), Poly(p-phenylene vinylene), Polythiophene Poly(thienylene vinylene), Polyaniline, or an equivalent thereto.

Specifically, when the first, the second, and the third pixels are a red pixel, a green pixel, and a blue pixel, respectively, the first space 16A is filled with a red filter material, the second space 16B is filled with a green filter material, and the third space 16C is filled with a blue filter material, resulting in the color filters 17, 18 and 19.

The red filter material, the green filter material, and the blue filter material are different materials from each other. Nevertheless, since the color filter materials are not subject to a reflow process, the color filter materials may be prevented from being damaged in the course of the reflow process. In addition, the shapes of the color filters may be prevented from being transformed in non-uniform manners due to the difference in the color filter materials.

A protection layer 20 is formed over the color filters 17, 18 and 19 and the color filter housings 14A. The protection layer 20 may be formed to have a given thickness along a surface of the underlying structure including the color filters 17, 18 and 19 and the color filter housings 14A.

The protection layer 20 may include an insulation material. For example, the protection layer 20 may include an oxide layer, a nitride layer, an oxynitride layer, or a stack layer thereof. The protection layer 20 may protect the color filters 17, 18 and 19 and the color filter housings 14A, and further serve as an anti-reflection layer.

The protection layer 20 may include material whose refractive index is smaller than that of the color filter housings 14A and the color filters 17, 18 and 19, and larger than that of air. Then, typical processes may follow to form an image sensor.

According to the embodiments described above, the color filter housings 14A are formed to have a uniform curvature for substantially all pixels, and color filter materials are filled in the spaces 16A, 16B and 16C defined by the color filter housings 14A to form the lens-type color filters. As a result, the lens-type color filters are formed to have a uniform shape for substantially all pixels.

In addition, since no reflow process is performed after the color filters are formed, disadvantages may be prevented from being caused by the reflow process, such as damage to the color filters, non-uniformity of the color filters, reduction in production yield due to complicated processes, etc.

Although various embodiments have been described for illustrative purposes, it will be apparent to those skilled in the art that various changes and modifications may be made without departing from the spirit and scope of the invention as defined in the following claims.

What is claimed is:

1. A method for forming an image sensor, the method comprising:
    forming sacrificial patterns over a substrate including a plurality of pixels, corresponding to the respective pixels;
    performing a reflow process on the sacrificial patterns to have a round edge;
    forming a mold layer along a surface of a structure including the sacrificial patterns;
    patterning the mold layer using mask patterns as an etching mask to form a plurality of color filter housings surrounding edges of the respective sacrificial patterns with a given curvature;
    removing the mask patterns and the sacrificial patterns to form spaces defined by the color filter housings; and
    filling the spaces with color filter materials to form a plurality of color filters over the respective pixels.

2. The method of claim 1, further comprising:
    forming a protection layer over a structure including the color filters and the color filter housings.

3. The method of claim 1, wherein the sacrificial patterns cover the respective pixels and exposes outer boundaries of the respective pixels.

4. The method of claim 1, wherein the mold layer includes material whose refractive index is larger than that of air and smaller than that of the color filters.

5. The method of claim 1, wherein the mask patterns cover the respective pixels while having openings exposing centers of the respective pixels.

6. The method of claim 1, wherein the mask patterns and the sacrificial patterns include the same material.

7. The method of claim 2, wherein the protection layer has a refractive index larger than that of air and smaller than those of the color filters and the color filter housings.

8. The method of claim 2, further comprising:
    forming microlens over the protection, corresponding to the respective pixels.

* * * * *